| (12) | United States Patent<br>Patelmo et al. | (10) Patent No.: US 7,072,239 B2<br>(45) Date of Patent: Jul. 4, 2006 |
|---|---|---|

(54) METHOD AND CIRCUIT FOR LOCATING ANOMALOUS MEMORY CELLS

(75) Inventors: Matteo Patelmo, Trezzo Sull'Adda (IT); Rosario Portoghese, Catania (IT); Massimo Bassi, Motta S. Anastasia (IT); Stefano Scuratti, San Giovanni La Punta (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 11/022,516

(22) Filed: Dec. 23, 2004

(65) Prior Publication Data

US 2005/0169089 A1    Aug. 4, 2005

(30) Foreign Application Priority Data

Dec. 23, 2003    (IT)    ............................ 2003A000052

(51) Int. Cl.
    *G11C 7/00*    (2006.01)
(52) U.S. Cl. .................................. 365/229; 365/189.07
(58) Field of Classification Search ................. 365/229
    See application file for complete search history.

(56) References Cited

U.S. PATENT DOCUMENTS 5,835,418 A  * 11/1998 Harasawa et al. ...... 365/189.05

* cited by examiner

*Primary Examiner*—Thong Q. Le
(74) *Attorney, Agent, or Firm*—Lisa K. Jorgenson; Allen, Dyer, Doppelt, Milbrath & Gilchrist, P.A.

(57) ABSTRACT

A method for locating in an array of memory cells a set of cells having a stand-by current that exceeds a certain value based on their programming state. The method includes selecting all the cells of the array of memory cells as a set of cells to be tested, and dividing the set of cells to be tested into subsets of cells, and repeatedly sensing a stand-by current absorbed by the array of memory cells after having changed the programming state of the subsets of cells. The sensed stand-by currents are compared and a subset of cells having a stand-by current exceeding the certain value are identified as a function of the comparison. The identified subset of cells is selected as a new set of cells to be tested, and the method is repeated. Otherwise, the testing stops with the just tested subset of cells having a stand-by current exceeding the certain value.

17 Claims, 2 Drawing Sheets

METHOD AND CIRCUIT FOR LOCATING ANOMALOUS MEMORY CELLS

FIELD OF THE INVENTION

The invention relates to quality controls performed during the fabrication of integrated devices that include an array of memory cells, and more particularly, to a method and related device for locating memory cells having a current absorption significantly larger than a certain design value when the memory cells are in a quiescent or standby state.

BACKGROUND OF THE INVENTION

Electronic devices having a reduced or minimized power consumption are increasingly requested, especially for battery supplied mobile systems. In addition to memory devices, many other integrated circuits may include an array of electrically programmable and erasable memory cells addressable through dedicated decoding circuitry.

Reference will be generally made to memory devices, or briefly memories, but the same considerations apply for all devices comprising an array of memory cells. For example, system-on-chip (SOC) devices may include an array of memory cells.

In mobile systems such as cellular phones, most of the time memories remain in a quiescent or standby state. The memories are resumed or exit from this state when a read or write operation of data is commanded.

Reducing the standby current of memory devices of cellular phones, as with other battery powered devices, is an important requirement for increasing the autonomy of cellular phones and other portable battery-supplied electronic devices.

Very sophisticated manufacturing processes are used for reducing power consumption. With these processes it is possible to form integrated circuits such as arrays of memory cells and their auxiliary circuits, and eventually even other subsystems with extremely small leakage currents. With advanced technologies, it is possible to obtain quiescent current absorption of less than 1 pA/µm, even at relatively high temperatures.

Usually, at the end of the fabrication process, a test-on-wafer of the integrated circuits is carried out for verifying that the power consumption of the memory included in each of the devices fabricated on the same wafer is smaller than the specified limit value.

Memory devices with a standby power consumption that exceed the value set by the specifications are discarded, notwithstanding the fact that they would operate correctly. Normally, extremely laborious tests for locating defective cells are not performed. Therefore, defective cells that may be the cause of an excessive current in standby are not substituted using the redundancy hardware resources associated with each respective memory array.

The current absorbed in a standby state by a single cell, even if larger than a maximum allowed value, is too small for being detectable with the measurement instruments that are typically available for this kind of test-on-wafer, such as an emission microscope (EMMI) and a liquid crystal (LC).

Moreover, it is difficult to locate cells with an anomalous (excessive) current absorption in a standby state by testing whether they are correctly programmable and readable. Notwithstanding the anomalous current absorption while in a standby state, these cells may be correctly programmed and read.

It would be useful to determine whether the defective cells are all the cells of the array or only a portion of them, i.e., whether the defective cells are spread apart or grouped together in one or more specific sectors. In the latter case, it would be possible to isolate electrically specific defective sectors of the array for studying and identifying the possible causes, and eventually correcting certain parameters of the fabrication process. In many cases, the devices would not necessarily be discarded but made usable according to specific consumption limits. By marginally reducing the design capacity, this improves the yield of the manufacturing process.

SUMMARY OF THE INVENTION

An object of the invention is to provide a fast iterative method for locating in a device comprising an array of memory cells the cells or sector of the array responsible for a relatively large current absorption when the device is in a standby state.

Tests performed on memory devices discarded because their standby current was larger than a design maximum value have demonstrated that very often the power consumption in a standby state of the discarded memory devices varies depending on whether all the cells are programmed or not.

If a memory device absorbs a standby current larger than a certain value, this could be due to the fact that the device contains a certain number of cells. The cells absorbing a standby current larger than a certain value will be referred to herein as "anomalous" cells. The programmed or non-programmed state of these cells increases the standby current.

Anomalous memory cells of an electronic device may be located by sensing repeatedly the standby current absorbed by the device, upon changing the programming state of the cells, and comparing the sensed currents.

This method allows location of cells belonging to an array of memory cells of an integrated device, the standby current of which may exceed a maximum pre-established value depending on the programming state of the cells to be identified as causing the excessive absorption. The method comprises carrying out iteratively the following operations:

a) preliminarily selecting all the cells of the array of memory cells of the device as the set of cells to be tested;

b) repeatedly sensing the standby current of the device by changing the programming state of subsets of cells of the device;

c) comparing the sensed currents and locating, if possible, a proper subset containing all the cells of the programming state of which determines a standby current absorption that exceeds the pre-established maximum value; and d) selecting the located subset as a new set of cells to be tested and returning to point b), otherwise identifying the just tested set of cells as the set of cells to be located.

Another aspect of the invention is directed to a circuit for locating a set of memory cells belonging to an array of memory cells of a device under test, wherein the standby current may exceed a maximum pre-established value depending on the programming state of the cells of this set of memory cells.

The circuit may comprise means for sensing a standby current absorbed by the device, a memory device for storing values of sensed standby currents, and comparison logic circuits for generating respective logic signals of comparison among the sensed currents and a pre-established threshold. A finite state machine may generate addresses of memory cells and internal control signals of the circuit, programming memory cells of the device and processing the comparison logic signals, and locating a set of anomalous memory cells.

The method may also be implemented as a computer readable medium.

BRIEF DESCRIPTION OF THE DRAWINGS

The different aspects and advantages of the invention will be even more evident through a description of an embodiment and referring to the attached drawings, wherein.

DETAILED DESCRIPTION OF THE PREFERRED EMBODIMENTS

Figure 1:
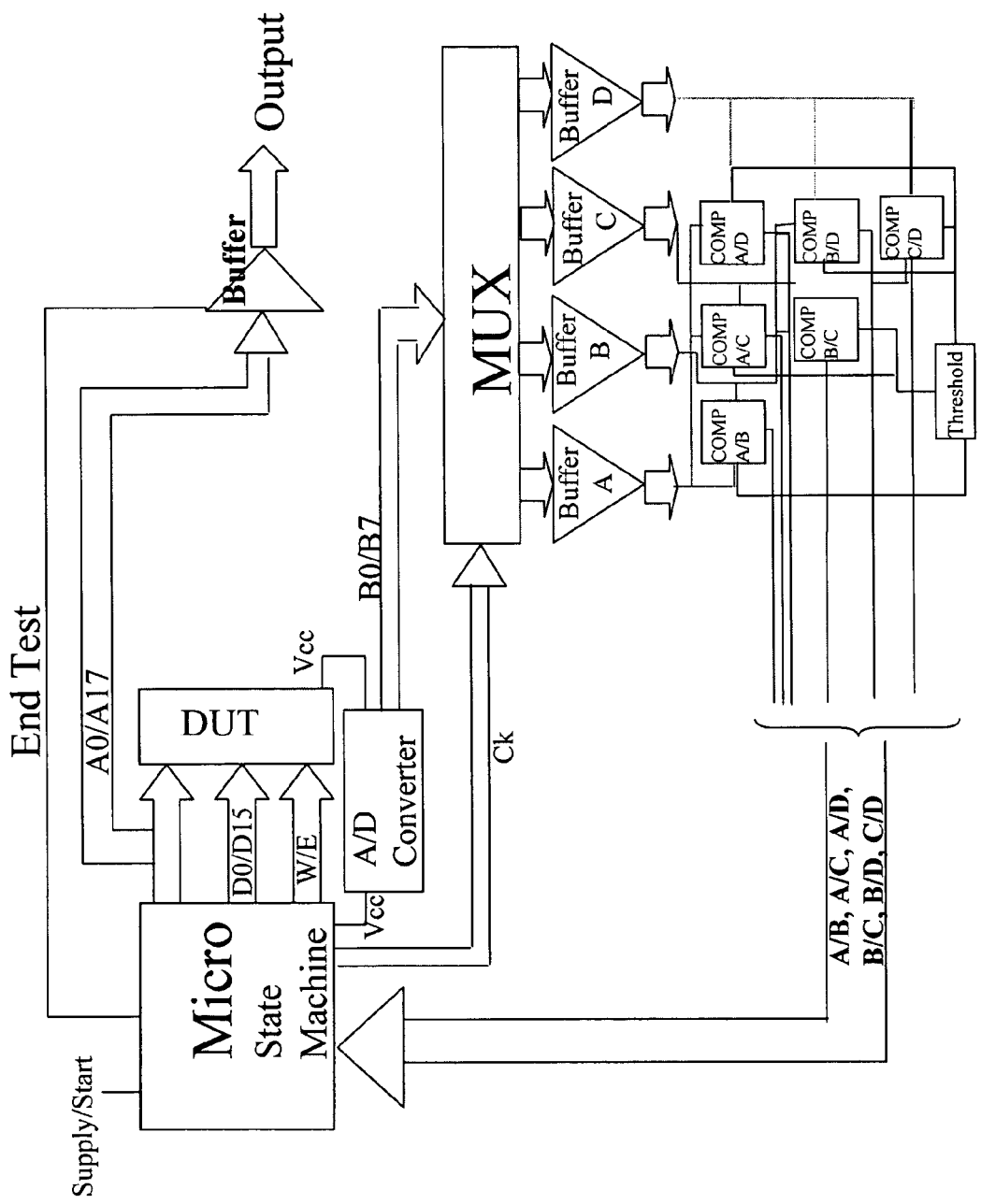
FIG. 1 depicts a block diagram of a circuit for sensing and comparing standby currents according to the invention.

The method in accordance with the invention is based on an iterative algorithm that substantially includes selecting a set of cells to be tested and in sensing repeatedly the standby current of the memory after having changed the programming state of only the cells of the selected set. The sensed currents are compared to identify a subset of cells contained in the selected set that includes only anomalous cells.

If this is not possible, then the selected and tested set of cells is identified as the set containing all the anomalous cells to be located, otherwise the identified subset is selected as a new set of memory cells to be tested and the process is repeated on the new set, and so forth. The process ends when a set of all anomalous cells is eventually located, or because of other reasons that will be illustrated below, it will not be possible to find a subset containing only anomalous cells.

At each iteration the number of cells of the set to be tested is reduced, thus the algorithm ends either because at last the set to be tested would contain only one cell, and therefore, it will not be possible to identify any proper subset thereof, or because the standby current of the device exceeds a pre-established maximum independently from the programming state of the cells of the set currently under test.

As the number of cells of the set to be tested increases at each iteration, the faster the algorithm will locate the set of anomalous cells. A particularly straightforward and convenient way of performing the method of the invention includes splitting the set to be tested into two disjoint subsets, i.e., first and second subsets. The method comprises sensing the standby current absorbed by the memory when all the cells of the set to be tested are not programmed (A), when all the cells are programmed (B), when all the cells of the first subset are programmed and all the cells of the second subset are not programmed (C), and when all the cells of the second subset are programmed and all the cells of the final subset are not programmed (D).

According to a preferred embodiment, two currents are considered equal to each other when the absolute value of their difference is smaller than a pre-established threshold THRESHOLD. For instance, in memory devices such as a 16 Mb LP SRAM manufactured with 0.13 µm technology, two standby currents may be considered different when the absolute value of their difference exceeds a threshold of 4 µA.

Given the four currents A, B, C, D, if one of the following conditions is verified:

$$(A=C)\neq(B=D); (A=D)\neq(B=C);$$

then one of the two subsets does not contain anomalous cells, while in all other cases this cannot be stated and the algorithm ends and identifies the tested set as the set of anomalous cells to be located. In fact, if the four currents differ from each other, then it is possible to state that anomalous cells are present in both subsets.

In contrast, if the four currents are equal to each other, then the excessively large current absorption of the device does not depend on the programming state of its memory cells. In all other cases it is not possible to say in which subset the anomalous cells are contained or whether the excessively large consumption is due to other causes.

More precisely, if $(A=C)\neq(B=D)$, the second subset does not contain any anomalous cell, which are thus all contained in the first subset. If $(A=D)\neq(B=C)$ the contrary holds. If one of these two cases occurs, the cells of the subset that does not contain any anomalous cell are programmed. The other subset is chosen as a new set of cells to be tested, and the above process steps are iteratively repeated until the algorithm ends.

Preferably, each of these sub-sets contains half the cells of the set to be tested. Therefore, at every iteration the number of cells to be tested is halved. The algorithm will then converge relatively fast even if the cells are very numerous because the number of iterations is proportional to the logarithm of the number of cells that form the memory.

The method of the invention provides an effective tool for locating anomalous cells without sensing the current absorbed by each single cell, which would be very difficult to perform or even impossible during a test-on-wafer, but much less burdensome by repeatedly sensing the total current absorbed in a standby state by the device under test.

A basic diagram of a circuit appropriate for implementing the method of the invention is depicted in FIG. 1. The circuit comprises a finite state machine MICRO, preferably a microprocessor, that generates addresses A0/A17 for selecting the cells belonging to a certain region or sector of the array of memory cells of the device DUT to be tested. The finite state machine MICRO programs through the bus D0/D15 the selected cells, and generates enable signals of the device DUT on the bus W/E.

An analog-to-digital converter senses the standby current absorbed by the device under test DUT by monitoring the current flowing in the respective supply line VCC. In the case of a memory device of a 16 Mb LP SRAM manufactured with a 0.13 µm technology, the standby current at 25° C. should be smaller than 25 µA. Thus, the memory can be used in a common 8 bits analog-to-digital converter with a resolution smaller than 100 nA.

The digital value of the sensed current is provided through the bus B0/B7 to a multiplexer MUX connected to a register for storing the four values A, B, C and D, that in the basic scheme of FIG. 1 are respectively the buffers BUFFER_A, BUFFER_B, BUFFER_C, BUFFER_D, selectable by the state machine MICRO through the bus CK.

At each iteration, the state machine MICRO stores the four values A, B, C and D in their respective buffers. The six comparison circuits COMP_A/B, COMP_A/C, COMP_A/D, COMP_B/C, COMP_B/D, COMP_C/D compare the stored values to each other and generate a respective logical active (1) comparison bit A/B, A/C, A/D, B/C, B/D, C/D when the two input values differ less than the threshold value THRESHOLD.

The state machine generates these bits, after having verified the following conditions (A=C)≠(B=D); (A=D)≠(B=C), according to the following table:

TABLE 1

|  | A/B | A/C | A/D | B/C | B/D | C/D |
|---|---|---|---|---|---|---|
| 1) (A = C) ≠ (B = D) | 0 | 1 | 0 | 0 | 1 | 0 |
| 2) (A = D) ≠ (B = C) | 0 | 0 | 1 | 1 | 0 | 0 |

If the case (A=C)≠(B=D) is verified, the state machine MICRO programs all the cells of the second subset, selects the first subset as the new set of cells to be tested, and repeats the algorithm sensing again the four currents A, B, C and D.

If the case (A=D)≠(B=C) is verified, the state machine acts as in the previous case inverting the roles of the first and second subsets, while in all other cases it stops the execution of the algorithm generating the logic signal END_TEST, and enables the output buffer BUFFER to generate on the output bus OUTPUT the addresses that locate the just tested set.

Figure 2:
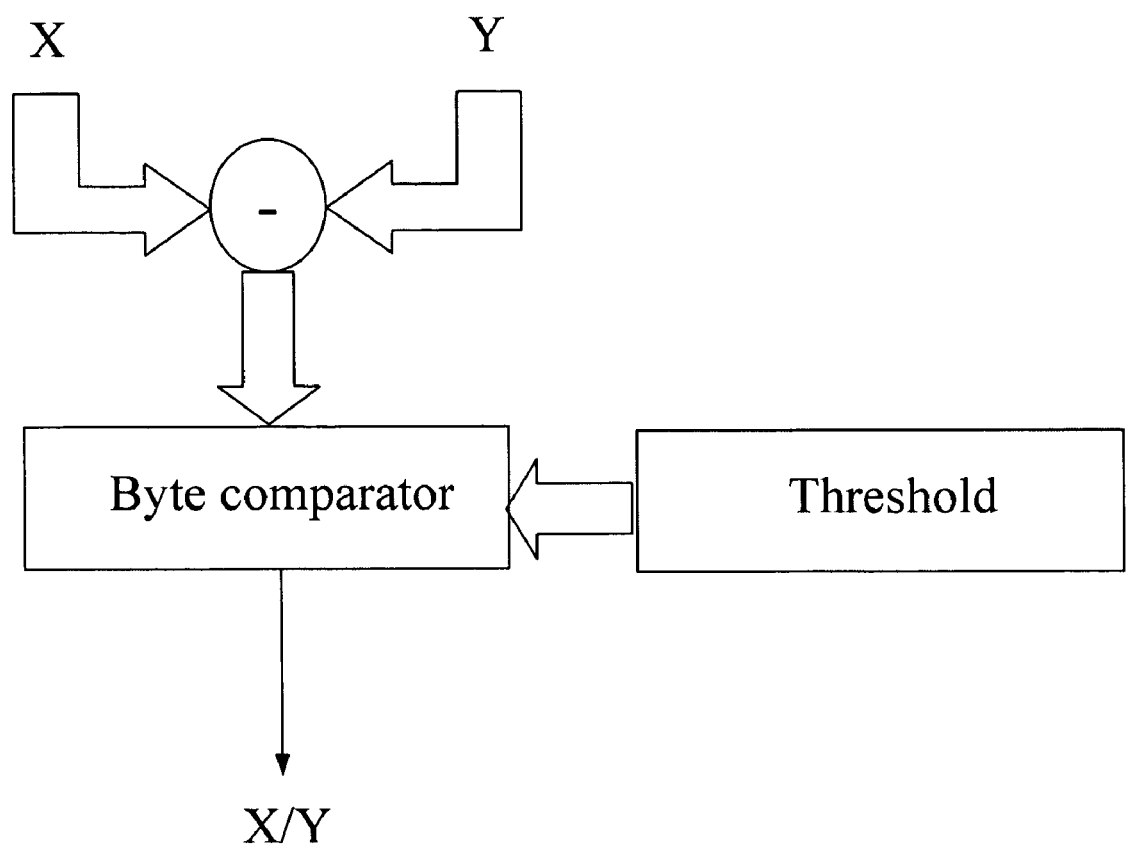
FIG. 2 shows a preferred embodiment of the circuit block COMP used in FIG. 1.

A straightforward way of forming a logic comparison circuit of the array COMP_A/B, COMP_A/C, COMP_A/D, COMP_B/C, COMP_B/D, COMP_C/D is depicted in FIG. 2. Each comparison circuit substantially comprises an adder that generates a difference bit-string between the input bit-strings X and Y, and a comparator BYTE_COMPARATOR that compares the difference bit-string with the pre-established threshold THRESHOLD for generating a comparison bit that is input to the state machine.

The logic comparison circuit is very straightforward and allows the sectors of anomalous memory cells of the array of cells contained in the device under test DUT to be identified. These cells may be isolated to make the device absorption in a standby state meet the specifications, and the isolated anomalous cells may be substituted with redundant cells for ensuring the full capacity and/or functionality of the device DUT. Therefore, it is possible to recover devices that otherwise would be discarded, thus enhancing the yield of the manufacturing process.

Moreover, the method and circuit of the invention are particularly useful for analyzing statistically which sectors of the array of memory cells tend to more frequently contain anomalous cells. If detected anomalous cells appear to concentrate in a certain sector, this could be caused by the fact that there are deterministic errors in the manufacturing process of the device. These deterministic errors could be identified and corrected, thus obtaining a more productive process with a lesser proportion of discarded devices.

That which is claimed is:

1. A method for locating in an array of memory cells a set of cells having a stand-by current that exceeds a certain value based on their programming state, the method comprising:
    a) selecting cells of the array of memory cells as a set of cells to be tested;
    b) dividing the set of cells to be tested into subsets of cells, and repeatedly sensing a stand-by current absorbed by the array of memory cells after having changed the programming state of the subsets of cells; and
    c) comparing the sensed stand-by currents, and identifying as a function of the comparison a subset of cells having a stand-by current exceeding the certain value, and selecting the identified subset of cells as a new set of cells to be tested and repeating the method from step b), otherwise identifying the just tested subset of cells as having a stand-by current exceeding the certain value.

2. A method according to claim 1, wherein step b) further comprises:
    b1) dividing the set of cells to be tested into first and second subsets of cells;
    b2) sensing first, second, third and fourth stand-by currents absorbed by the array of memory cells in the following conditions
        when all the cells of the set are not programmed,
        when all the cells of the set are programmed,
        when all the cells of the first subset are programmed while all the cells of the second subset are not programmed, and
        when all the cells of the second subset are programmed while all the cells of the first subset are not programmed; and wherein step c) further comprises
    c0) comparing the first, second, third and fourth stand-by currents for determining if one of the first and second subsets of cells in a programmed state causes their stand-by current to exceed the certain value, and if one of the first and second subsets of cells in the programmed state causes their stand-by current to exceed the certain value, then selecting this subset of cells as a new set of cells to be tested, and programming all the cells of the other subset of cells and repeating the method from step b1), otherwise identifying the tested set of cells as having a stand-by current exceeding the certain value.

3. A method according to claim 2, wherein the determining in step c0) comprises:
    c1) if an absolute value of a difference between the first and third stand-by currents is smaller than a threshold, an absolute value of a difference between the second and fourth stand-by currents is smaller than the threshold, and an absolute value of a difference between the first and second stand-by currents is larger than the threshold, then selecting the first subset of cells as the new set of cells to be tested and programming all the cells of the second subset of cells, and repeating the method from step b1);
    c2) if an absolute value of a difference between the first and fourth stand-by currents is smaller than the threshold, an absolute value of a difference between the second and third stand-by currents is smaller than the threshold, and an absolute value of a difference between the first and second stand-by currents is larger than the threshold, then selecting the second subset of cells as the new set of cells to be tested, and programming all the cells of the first subset and repeating the method from step b1); and
    c3) if the comparisons of steps c1) and c2) are not verified, then interrupting the method and identifying the tested set as having a stand-by current exceeding the certain value.

4. A circuit for locating in an array of memory cells a set of cells having a stand-by current that exceeds a certain value based on their programming state, the circuit comprising:
    a finite state machine for
        a) selecting cells of the array of memory cells as a set of cells to be tested, and b) dividing the set of cells to be tested into subsets of cells, and repeatedly sensing a stand-by current absorbed by the array of memory cells after having changed the programming state of the subsets of cells;
a sensing circuit for sensing the stand-by current of the subsets of cells;
a storage circuit for storing the sensed stand-by currents; and
a plurality of logic comparison circuits for
c) comparing the sensed stand-by currents, and identifying as a function of the comparison a subset of cells having a stand-by current exceeding the certain value, and selecting the identified subset of cells as a new set of cells to be tested and repeating the process from step b), otherwise identifying the just tested subset of cells as having a stand-by current exceeding the certain value.

5. A circuit according to claim 4, wherein said finite state machine for step b) comprises:
b1) dividing the set of cells to be tested into first and second subsets of cells.

6. A circuit according to claim 5, wherein said sensing circuit for step b) further comprises:
b2) sensing first, second, third and fourth stand-by currents absorbed by the array of memory cells in the following conditions
when all the cells of the set are not programmed,
when all the cells of the set are programmed,
when all the cells of the first subset are programmed while all the cells of the second subset are not programmed, and
when all the cells of the second subset are programmed while all the cells of the first subset are not programmed.

7. A circuit according to claim 6, wherein said plurality of logic comparison circuits perform the following:
c0) comparing the first, second, third and fourth stand-by currents for determining if one of the first and second subset of cells in a programmed state causes the stand-by currents to exceed the certain value, and if one of the first and second subset of cells in the programmed state causes the stand-by currents to exceed the certain value, then said finite state machine selects this subset of cells as a new set of cells to be tested, and programs all the cells of the other subset and repeating the method from step b1), otherwise identifying the tested set of cells as having a stand-by current exceeding the certain value.

8. A circuit according to claim 7, wherein the determining in step c0) comprises:
c1) if an absolute value of a difference between the first and third stand-by currents is smaller than a threshold, an absolute value of a difference between the second and fourth stand-by currents is smaller than the threshold, and an absolute value of a difference between the first and second stand-by currents is larger than the threshold, then selecting the first subset of cells as the new set of cells to be tested and programming all the cells of the second subset of cells, and repeating the method from step b1);
c2) if an absolute value of a difference between the first and fourth stand-by currents is smaller than the threshold, an absolute value of a difference between the second and third stand-by currents is smaller than the threshold, and an absolute value of a difference between the first and second stand-by currents is larger than the threshold, then-selecting the second subset of cells as the new set of cells to be tested, and programming all the cells of the first subset and repeating the method from step b1); and
c3) if the comparisons of steps c1) and c2) are not verified, then interrupting the method and identifying the tested set of cells as having a stand-by current absorption exceeding the certain value.

9. A circuit according to claim 4, wherein said finite state machine generates addresses for the selected cells of the array of memory cells.

10. A circuit according to claim 6, wherein said finite state machine programs the memory cells.

11. A circuit according to claim 8, wherein said finite state machine processes the comparisons in steps c1) and c2).

12. A circuit according to claim 4, further comprising a bus connected between said finite state machine and said storage circuit; wherein the array of memory cells are in a device under test; and wherein said sensing circuit comprises an analog-to-digital converter connected to a supply line of the device under test and generates on said bus a digital signal representative of the stand-by current absorbed by the device under test.

13. A circuit according to claim 12, wherein said storage circuit comprising:
a multiplexer controlled by said finite state machine and being input with the digital signal; and
first, second, third and fourth buffers respectively loaded by said multiplexer with the first, second, third and fourth stand-by currents.

14. A circuit according to claim 4, wherein said each logic comparison circuit comprises:
an adder for subtracting the stand-by currents being compared, and generating a respective difference signal; and
a comparator for comparing the respective difference signals with a threshold, and generating a respective logic comparison signal based upon the comparison.

15. A computer-readable medium having stored thereon a data structure for locating in an array of memory cells a set of cells having a stand-by current that exceeds a certain value based on their programming state, the computer-readable medium comprising:
a) a first data field for selecting cells of the array of memory cells as a set of cells to be tested;
b) a second data field for dividing the set of cells to be tested into subsets of cells, and repeatedly sensing a stand-by current absorbed by the array of memory cells after having changed the programming state of the subsets of cells; and
c) a third data field for comparing the sensed stand-by currents, and identifying as a function of the comparison a subset of cells having a stand-by current exceeding the certain value, and selecting the identified subset of cells as a new set of cells to be tested and repeating the process from step b), otherwise identifying the just tested subset of cells as having a stand-by current absorption exceeding the certain value.

16. A computer-readable medium according to claim 15, wherein the second data field for step b) further comprises:
b1) a fourth data field for dividing the set of cells to be tested into first and second subsets of cells;
b2) a fifth data field for sensing first, second, third and fourth stand-by currents absorbed by the array of memory cells in the following conditions
when all the cells of the set are not programmed,
when all the cells of the set are programmed, when all the cells of the first subset are programmed while all the cells of the second subset are not programmed, and when all the cells of the second subset are programmed while all the cells of the first subset are not programmed; and wherein the third data field in step c) further comprises c0) a sixth data field for comparing the first, second, third and fourth stand-by currents for determining if one of the first and second subsets of cells in a programmed state causes the stand-by current to exceed the certain value, and if one of the first and second subsets of cells in the programmed state causes the stand-by current to exceed the certain value, then selecting this subset of cells as a new set of cells to be tested, and programming all the cells of the other subset and repeating the process from step b1), otherwise identifying the tested set of cells as having a stand-by current exceeding the certain value.

17. A computer-readable medium according to claim 16, wherein the sixth data field in step c0) comprises:

c1) a seventh data field for if an absolute value of a difference between the first and third stand-by currents is smaller than a threshold, an absolute value of the difference between the second and fourth currents is smaller than the threshold, and an absolute value of a difference between the first and second stand-by currents is larger than the threshold, then selecting the first subset of cells as the new set of cells to be tested and programming all the cells of the second subset of cells, and repeating the process from step b1);

c2) an eighth data field for if an absolute value of a difference between the first and fourth stand-by currents is smaller than the threshold, an absolute value of a difference between the second and third stand-by currents is smaller than the threshold, and an absolute value of a difference between the first and second stand-by currents is larger than the threshold, then selecting the second subset of cells as the new set of cells to be tested, and programming all the cells of the first subset and repeating the method from step b1); and c3) a ninth data field for if the comparisons of steps c1) and c2) are not verified, then interrupting the method and identifying the tested set of cells as having a stand-by current exceeding the certain value.

* * * * *